(12) United States Patent
Wu

(10) Patent No.: US 7,109,664 B2
(45) Date of Patent: Sep. 19, 2006

(54) LED LIGHT WITH BLAZE-LIKE RADIANCE EFFECT

(76) Inventor: Tsu-Yeh Wu, PO Box 82-144, Taipei (TW)

( * ) Notice: Subject to any disclaimer, the term of this patent is extended or adjusted under 35 U.S.C. 154(b) by 453 days.

(21) Appl. No.: 10/735,919

(22) Filed: Dec. 16, 2003

(65) Prior Publication Data

US 2005/0127269 A1     Jun. 16, 2005

(51) Int. Cl.
*F21S 4/00*     (2006.01)
*H05B 37/00*     (2006.01)

(52) U.S. Cl. .............................. 315/185 S; 315/200 A; 315/56; 362/362; 362/234; 250/200; 250/552

(58) Field of Classification Search ............ 315/185 S, 315/200 A, 56–59; 362/362; 250/200, 552
See application file for complete search history.

(56) References Cited

U.S. PATENT DOCUMENTS 5,130,531 A * 7/1992 Ito et al. ..................... 250/216
5,847,512 A * 12/1998 Baba et al. .................... 315/51
6,111,359 A * 8/2000 Work et al. .................... 315/56
6,509,832 B1 * 1/2003 Bauer et al. ............. 340/425.5
7,029,145 B1 * 4/2006 Frederick .................... 362/234
2003/0076051 A1 * 4/2003 Bowman et al. ........ 315/200 A

* cited by examiner

*Primary Examiner*—Tuyet Vo
*Assistant Examiner*—Tung Le

(57) ABSTRACT

This invention concerns a LED light which emits blaze-like radiance comprising a negative prop stand, with one end extending to a negative receiver which can connect to the negative power supply, a positive prop stand with one end extending to a positive receiver which can connect to the positive power supply, a first chip and a second chip established on the negative prop stand, and the first chip is linked to the positive prop stand by a first gold wire, a flicker IC chip established on the positive prop stand, and has the function of continuous linking and breaking of the circuit, the said flicker IC chip is linked to the negative prop stand and the second chip each by a second gold wire and a third gold wire, a plastic sealing cover which covers the interior of the negative prop stand, the positive prop stand, the first chip, the second chip, and the flicker IC chip.

5 Claims, 4 Drawing Sheets

LED LIGHT WITH BLAZE-LIKE RADIANCE EFFECT

BACKGROUND OF THE INVENTION (a) Technical Field of the Invention

The present invention is related to the innovative design in the structure of a LED light, especially LED light that emits blaze-like radiance with flickering and waving visual effects.

(b) Description of the Prior Art

Ever since Edison invented the light bulb, it not only brought light to the world, but also replaced traditional lighting instruments such as candles, oil lamps and torches. It greatly improved the quality of life for people. However, general light bulbs rely mainly on electric current passing through the tungsten filaments to produce light. Therefore, although they are more safe and convenient to use with much lighter effects compared to traditional lighting instruments that they apply to various lighting instruments, they cannot produce the blaze radiance of traditional lighting instruments. Traditional lighting instruments such as candles, oil lamps, and torches produce blaze, which give people flickering and wavering visual effect. The flickering and wavering visual effects not only provide people the feelings of harmony, warmth, variety and passion, but also build the atmosphere of mystery, sacredness, romance and festivity. Consequently, there are still many who apply traditional lighting instruments to some specific occasions and places, such as traditional festivals, temples, churches, restaurants, weddings and funerals. Moreover, the said light bulbs also have defects such as high temperature, power consuming, and short life spans.

Although every country is dedicated on developing a kind of LED (Light Emitting Diode), which would improve the aforementioned light bulb defects such as high temperature, power consuming, and short life span. Furthermore, after all the years of development, innovation and research, the said LED has also been fully applied to various electric appliances, information billboards, communication products and light bulbs, and in turn become so closely related to people's lives to the extent that it is inseparable. However, the LED light generally seen nowadays has functions to simply emit, die out and flicker. Furthermore, when it emits, it has simply a certain brightness of radiance. Therefore, it also cannot produce blaze-like effects like traditional lighting instruments, forming the flickering and wavering radiance which provide people the feelings of harmony, warmth, variety and passion, and build the atmosphere of mystery, sacredness, romance and festivity.

Hence, the inventor has focused on the defect of the preceding prior art LED light not being able to form the flickering and wavering radiance of the blaze. Through deep conception and enthusiastic research in ways to improve the aforementioned defect, this invention has come about over a long period of dedicated refinement and tryout designs.

SUMMARY OF THE INVENTION

It is the major object of the present invention to provide a LED light that emits blaze-like radiance with flickering and waving visual effects.

Specifically speaking, this invention is related to a LED light that emits blaze-like radiance; the structure consists of the followings. A negative prop stand with one end extending to a negative receiver, the said negative receiver can connect to the negative power supply. A positive prop stand with one end extending to a positive receiver, the said positive receiver can connect to the positive power supply. A first chip and a second chip are established on the said negative prop stand, and the first chip is linked to the positive prop stand with a first gold wire. A flicker IC chip is established on the positive prop stand, and the said flicker IC chip has the function of continuous linking and breaking of the circuit. In addition, the said flicker IC chip is also each connected to the negative prop stand and the second chip with a second gold wire and a third gold wire. A plastic sealing cover is wrapped around the exterior of the negative prop stand, the positive prop stand, the first chip, the second chip, and the flicker IC chip. This way, the said first chip will produce permanent light when connected to power, and the said second chip will produce flickering light by the function of the flicker IC chip. With the coordination of the two, the whole will emit blaze-like radiance with flickering and wavering visual effects.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 2:
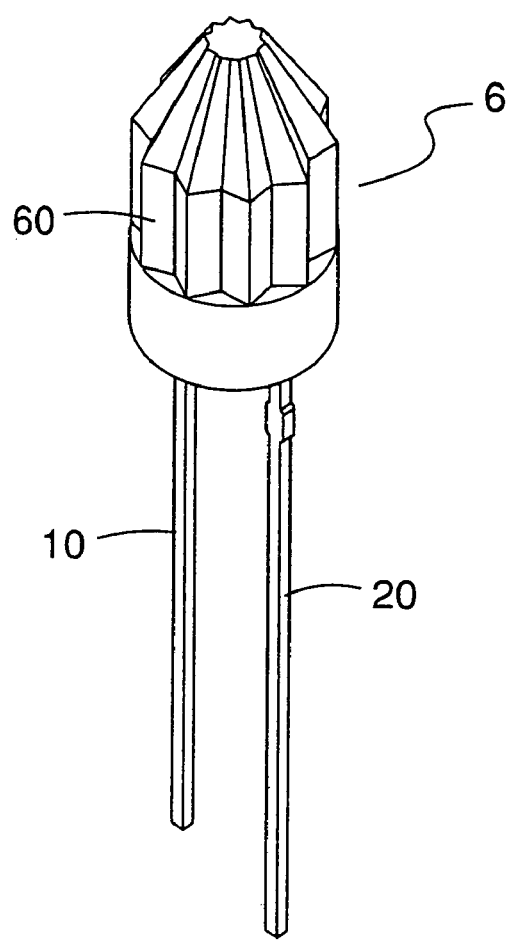
FIG. 2 is a perspective view of the present invention.
Figure 1:
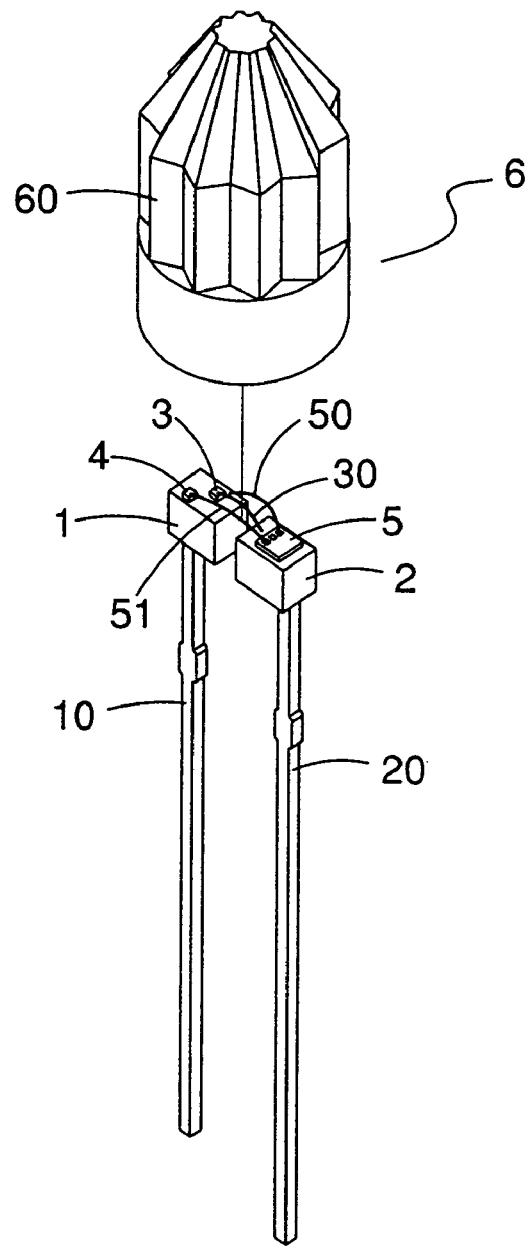
FIG. 1 is an exploded view of the present invention.
Figure 3:
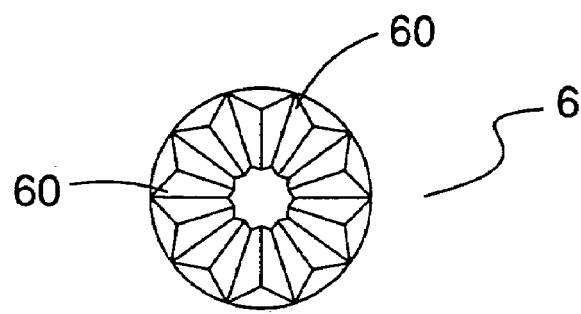
FIG. 3 is a vertical view of the present invention.
Figure 4:
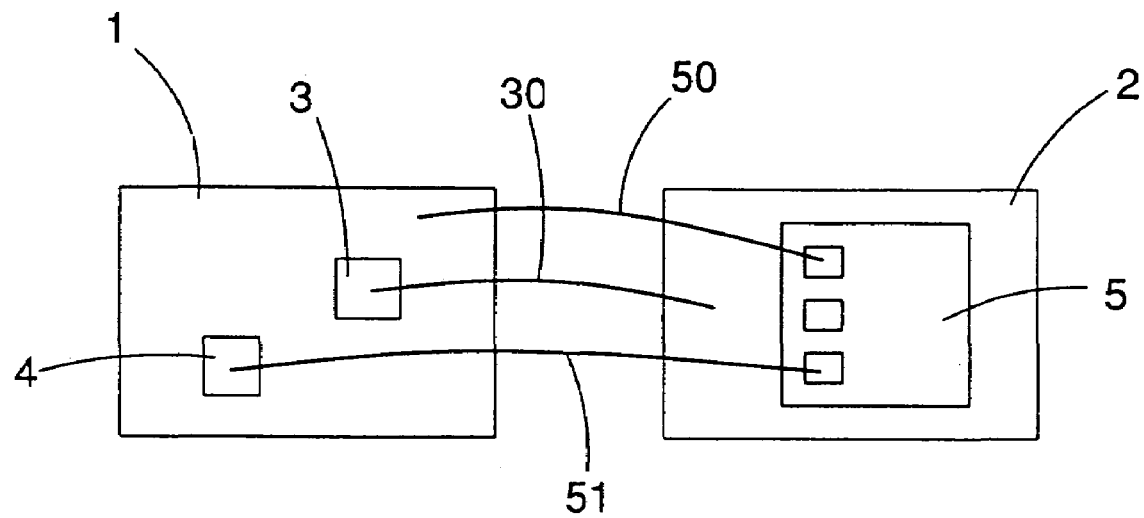
FIG. 4 is a fixed chip bonding location map of the present invention.

Referring to FIGS. 1~4, it is a LED light which emits blaze-like radiance, and the structure consists of:

A negative prop stand (1) with one end extending to a negative receiver (10), the said negative receiver (10) can connect to the negative power supply.

A positive prop stand (2) with one end extending to a positive receiver (20), the said positive receiver (20) can connect to the positive power supply.

A first chip (3) and a second chip (4) are established on the said negative prop stand (1), and the first chip (3) is linked to the positive prop stand (2) with a first gold wire (30).

A flicker IC chip (5) is established on the positive prop stand (2), and the said flicker IC chip (5) has the function of continuous linking and breaking of the circuit. In addition, the said flicker IC chip (5) is also each connected to the negative prop stand (1) and the second chip (4) with a second gold wire (50) and a third gold wire (51).

A plastic sealing cover (6) is wrapped around the exterior of the negative prop stand (1), the positive prop stand (2), the first chip (3), the second chip (4), and the flicker IC chips (5). The shape of the plastic sealing cover (6) is a column, with the top half in awl shape. There is a complex of perpendicular tines (60) on the sides of the said plastic sealing cover (6) to form the sides of the said plastic sealing cover (6) into a star-shaped polyhedron, it also adds to the refraction effects when the interior chips emit light.

Figure 5:
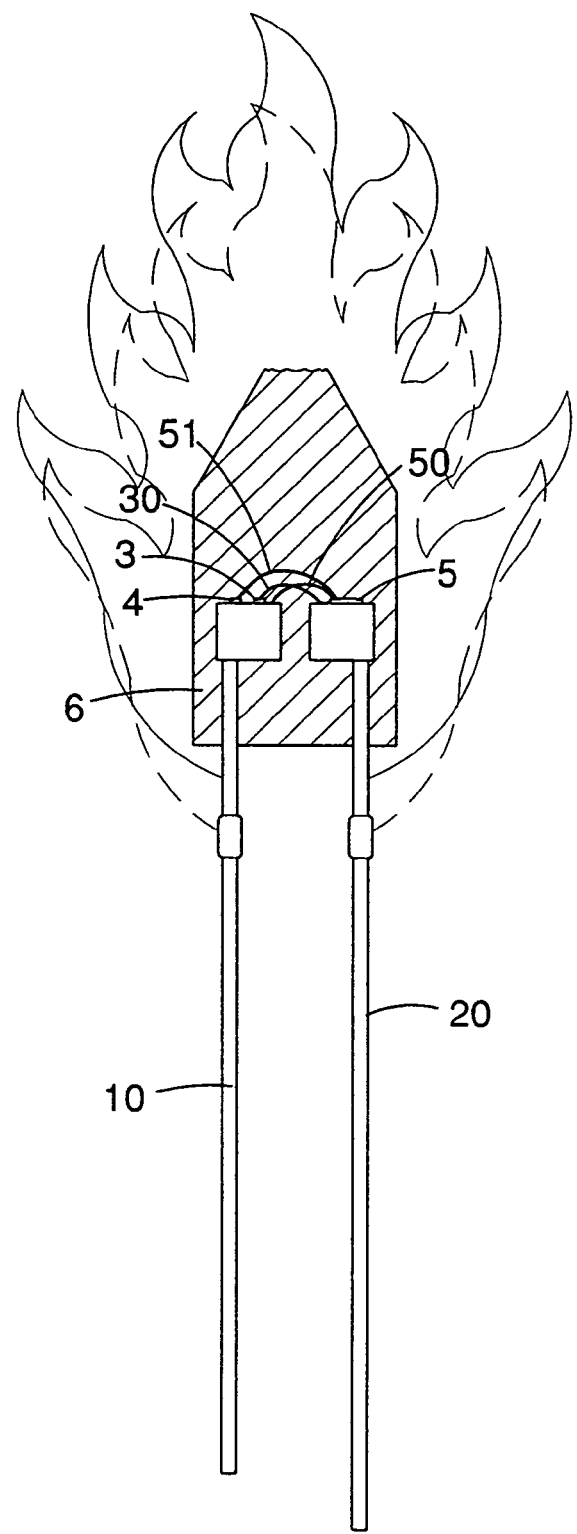
FIG. 5 is a sectional view of the present invention.
Figure 6:
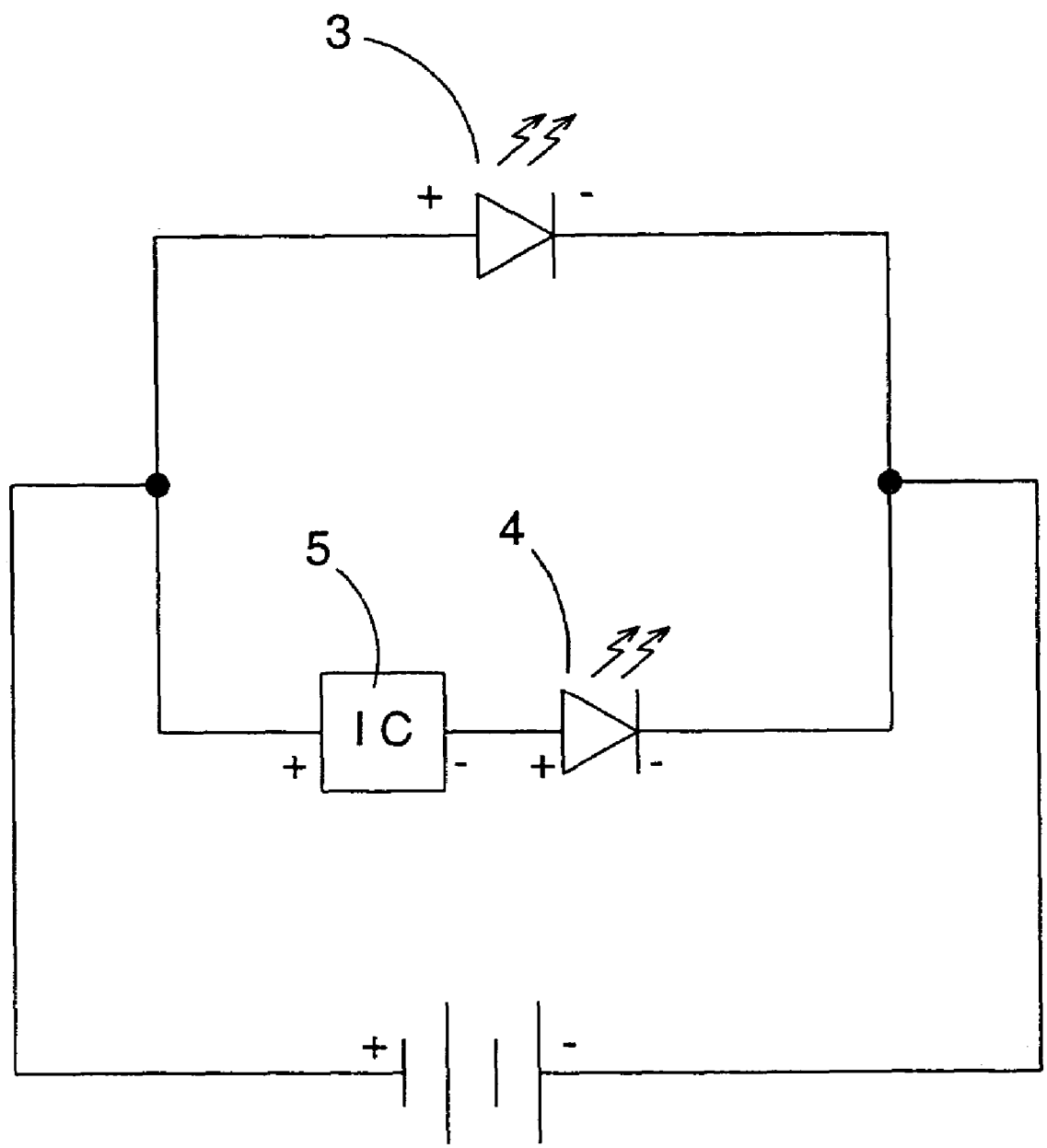
FIG. 6 is a circuit diagram of the present invention.

Referring to FIGS. 3~6, when the positive receiver (20) and the negative receiver (10) is each connected to the positive and negative power supply, the first chip (3) will form a circuit with the power supply by the first gold wire (30), and produce permanent light. The second chip (4) will form a circuit with the power supply by the second gold wire (50), the flicker IC chip (5) and the third gold wire (51), and produce flickering light. The coordination of the two emits blaze-like radiance with flickering and wavering effects that are sometimes strong and sometimes weak, and through the tine (60) shape on the sides of the plastic sealing cover (6), the blaze-like radiance has a more obvious effect due to the refractions.

When the present invention LED light was connected to power, the said first chip (3) will produce permanent light while the said second chip (4) will produce flickering light by the function of the flicker IC chip (5). Therefore, the whole will emit blaze-like radiance with flickering and wavering visual effects, and build the atmosphere of mystery, sacredness, romance and festivity like traditional lighting instruments. It is also applicable to occasions such as traditional festivals, temples, churches, restaurants, weddings and funerals. Furthermore, the present invention LED light is not only more safe and convenient to use with much lighter effects compared to traditional lighting instruments, but also has the effects of lower temperature, power saving, and longer life-span compared to prior art light bulb.

Moreover, when the present invention LED light shines, the second chip (4) will produce flickering light by the function of the flicker IC chip (5). Therefore, it will not emit light harsh to the eyes, but form a gentle light, and can also be applied to general traffic signals or car lights. This can avoid defects such as sore eyes caused by gazing for a long period or lights that are too harsh for the eyes.

To sum up, it should be known that the present invention possesses industrial utilization and advancement, and there are no similar products or publishes with novelty among the same kind of products. Therefore, it meets the applying conditions for invention patent.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A LED light, which emits blaze-like radiance comprising:
    a negative prop stand with one end extending downwards to a negative receiver, and the negative receiver can connect to a negative power supply;
    a positive prop stand with one end extending downwards to a positive receiver, and the positive receiver can connect to a positive power supply;
    a first chip and a second chip established on the negative prop stand, and the said first chip is connected to the positive prop stand by a first gold wire;
    a flicker IC chip established on the positive prop stand, and the flicker IC chip has the function of continuous linking and breaking of the circuit, and the said flicker IC chip is connected to the negative prop stand and the second chip each by a second gold wire and a third gold wire;
    a plastic sealing cover that covers the interior of the negative prop stand, the positive prop stand, the first chip, the second chip, and the flicker IC chip.

2. A LED light, which emits blaze-like radiance comprising:
    a negative prop stand with one end extending downwards to a negative receiver, and the negative receiver can connect to a negative power supply;
    a positive prop stand with one end extending downwards to a positive receiver, and the positive receiver can connect to a positive power supply;
    a first chip and a second chip established on the negative prop stand, and the said first chip is connected to the positive prop stand by a first gold wire;
    a flicker IC chip established on the positive prop stand, and the flicker IC chip has the function of continuous linking and breaking of the circuit, and the said flicker IC chip is connected to the negative prop stand and the second chip each by a second gold wire and a third gold wire;
    a plastic sealing cover which covers the interior of the negative prop stand, the positive prop stand, the first chip, the second chip, and the flicker IC chip; and the top half is in awl shape with a complex of perpendicular tines on the sides of the said plastic sealing cover.

3. The LED light that emits blaze-like radiance as claimed in claim 2, the said plastic sealing cover forms a star-shaped polyhedron.

4. The LED light that emits blaze-like radiance as claimed in claim 2, wherein the interior circuit of the flicker IC chip is an unsteady state multi-harmonic oscillator.

5. The LED light which emits blaze-like radiance as claimed in claim 4, wherein the flicker IC chip circuit is a unsteady state multi-harmonic oscillator with the frequency of 8–18 HZ/sec.

* * * * *